United States Patent
Kim et al.

(10) Patent No.: US 10,720,260 B2
(45) Date of Patent: Jul. 21, 2020

(54) PASTE FOR FORMING SOLAR CELL ELECTRODE AND ELECTRODE PREPARED USING THE SAME

(71) Applicant: SAMSUNG SDI CO., LTD., Yongin-si, Gyeonggi-do (KR)

(72) Inventors: Dong Suk Kim, Uiwang-si (KR); JuHee Kim, Uiwang-si (KR); Min Su Park, Uiwang-si (KR); Young Ki Park, Uiwang-si (KR); Sang Hyun Yang, Uiwang-si (KR); Seok Hyun Jung, Uiwang-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 53 days.

(21) Appl. No.: 14/936,026

(22) Filed: Nov. 9, 2015

(65) Prior Publication Data
US 2016/0141068 A1    May 19, 2016

(30) Foreign Application Priority Data

Nov. 13, 2014 (KR) .......................... 10-2014-0158299

(51) Int. Cl.
*H01B 1/20* (2006.01)
*H01B 1/22* (2006.01)
*H01L 31/0224* (2006.01)

(52) U.S. Cl.
CPC .................. *H01B 1/20* (2013.01); *H01B 1/22* (2013.01); *H01L 31/022425* (2013.01)

(58) Field of Classification Search
None
See application file for complete search history.

(56) References Cited

U.S. PATENT DOCUMENTS

| | | | | |
|---|---|---|---|---|
| 2011/0095240 A1* | 4/2011 | Nakamura | ............. | C03C 3/062 252/514 |
| 2011/0232746 A1* | 9/2011 | Carroll | ................. | B22F 1/0059 136/256 |
| 2012/0160314 A1* | 6/2012 | Prince | ...................... | H01B 1/16 136/256 |
| 2012/0168691 A1* | 7/2012 | Yoshino | .................. | H01B 1/22 252/514 |
| 2014/0145122 A1* | 5/2014 | Sawai | ..................... | H01J 29/90 252/514 |
| 2014/0191167 A1 | 7/2014 | Huang et al. | | |
| 2015/0364622 A1* | 12/2015 | Jung | .............. | H01L 31/022425 252/514 |
| 2016/0163890 A1* | 6/2016 | Yeh | ......................... | C03C 3/122 136/256 |
| 2016/0163891 A1* | 6/2016 | Yeh | ......................... | H01B 1/22 136/256 |

FOREIGN PATENT DOCUMENTS

| | | | |
|---|---|---|---|
| CN | 101066839 | * | 11/2007 |
| CN | 101164943 | * | 4/2008 |
| CN | 102476919 A | | 5/2012 |
| CN | 102674696 A | | 9/2012 |
| CN | 102947235 A | | 2/2013 |
| CN | 104078092 A | | 10/2014 |
| CN | 104103339 A | | 10/2014 |
| CN | 102476919 B | * | 1/2015 |
| KR | 10-0868621 B1 | | 11/2008 |
| TW | 201426764 A | | 7/2014 |
| TW | 201428080 | * | 7/2014 |
| TW | 201428771 A | | 7/2014 |
| TW | 201431819 A | | 8/2014 |
| WO | WO 2012/141187 A1 | | 10/2012 |
| WO | WO 2013005600 | * | 1/2013 |
| WO | WO-2014157958 A1 | * | 10/2014 ..... H01L 31/022425 |

OTHER PUBLICATIONS

Office Action in the corresponding Taiwanese Patent Application No. 104136932 dated Nov. 22, 2016.
Office Action in the corresponding Chinese Patent Application No. 201510763232.7 dated Dec. 2, 2016.
Office Action in the corresponding Chinese Patent Application No. 201510763232.7 dated Jul. 6, 2018.

* cited by examiner

*Primary Examiner* — Tanisha Diggs
(74) *Attorney, Agent, or Firm* — Lee IP Law, P.C.

(57) ABSTRACT

A paste for solar cell electrodes includes a conductive powder, a glass frit, and an organic vehicle. The glass frit includes bismuth (Bi), tellurium (Te), and antimony (Sb), and has a mole ratio of bismuth (Bi) to tellurium (Te) of about 1:1 to about 1:30.

7 Claims, 1 Drawing Sheet

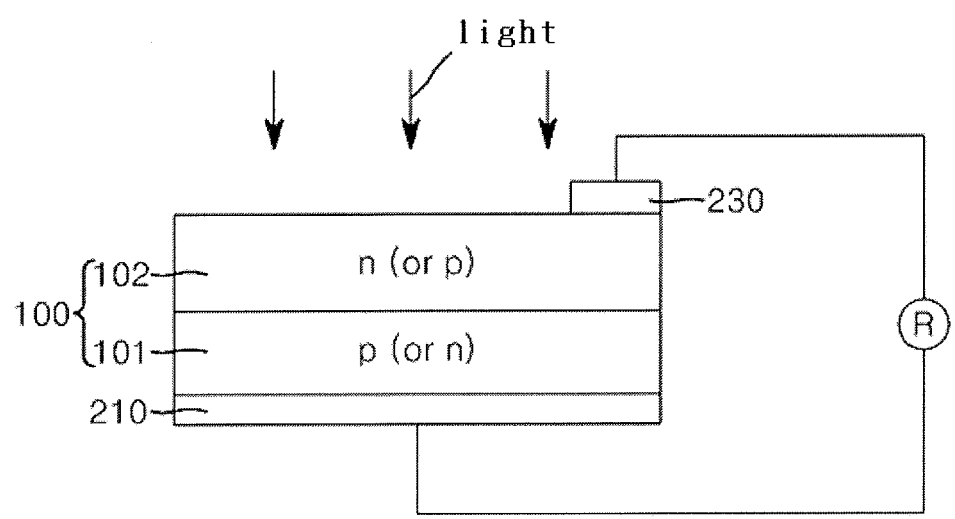

PASTE FOR FORMING SOLAR CELL ELECTRODE AND ELECTRODE PREPARED USING THE SAME

CROSS-REFERENCE TO RELATED APPLICATION

Korean Patent Application No. 10-2014-0158299, filed on Nov. 13, 2014, in the Korean Intellectual Property Office, and entitled: "Paste for Forming Solar Cell Electrode and Electrode Prepared Using the Same," is incorporated by reference herein in its entirety.

BACKGROUND

1. Field

Embodiments relate to a paste for solar cell electrodes and an electrode prepared from the same.

2. Description of the Related Art

Solar cells generate electric energy using the photovoltaic effect of a p-n junction, which converts photons of sunlight into electricity. In the solar cell, front and rear electrodes are formed on upper and lower surfaces of a semiconductor wafer or substrate with the p-n junction, respectively. Then, the photovoltaic effect of the p-n junction is induced by sunlight entering the semiconductor wafer. Electrons generated by the photovoltaic effect of the p-n junction provide electric current flowing through the electrodes to the outside.

SUMMARY

Embodiments are directed to a paste for solar cell electrodes including a conductive powder, a glass frit, and an organic vehicle. The glass frit includes bismuth (Bi), tellurium (Te), and antimony (Sb), and has a mole ratio of bismuth (Bi) to tellurium (Te) of about 1:1 to about 1:30.

The glass frit may further include at least one of lithium (Li), sodium (Na), zinc (Zn), and tungsten (W).

The glass fit may have a mole ratio of bismuth (Bi) to antimony (Sb) of about 1:0.05 to about 1:5.

The paste for solar cell electrodes may include from about 60 wt % to about 90 wt % of the conductive powder, from about 1 wt % to about 10 wt % of the glass fit, and from about 5 wt % to about 30 wt % of organic vehicle.

The conductive powder may include at least one of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO).

The glass frit may have an average particle diameter (D50) of about 0.1 µm to about 5 µm.

The paste for solar cell electrodes may further include at least one of a dispersant, a thixotropic agent, a plasticizer, a viscosity stabilizer, an anti-foaming agent, a pigment, a UV stabilizer, an antioxidant, and a coupling agent.

Embodiments are also directed to a solar cell electrode prepared from the paste for solar cell electrodes.

BRIEF DESCRIPTION OF THE DRAWINGS

Features will become apparent to those of skill in the art by describing in detail exemplary embodiments with reference to the attached drawings in which:

FIG. 1 illustrates a schematic view of the structure of a solar cell in accordance with an embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURES, the dimensions of layers and regions may be exaggerated for clarity of illustration. It will also be understood that when a layer or element is referred to as being "on" another layer or substrate, it can be directly on the other layer or substrate, or intervening layers may also be present. Like reference numerals refer to like elements throughout.

Paste for Solar Cell Electrodes

A paste for solar cell electrodes includes a conductive powder, a glass frit, and an organic vehicle.

Conductive Powder

The conductive powder may include silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), magnesium (Mg), indium tin oxide (ITO), or the like. The conductive powder may be used alone or as mixtures or alloys thereof. For example, the conductive powder may include a silver (Ag) particle alone, or may include a silver (Ag) particle and further include, in addition to the silver (Ag) particle, aluminum (Al), nickel (Ni), cobalt (Co), iron (Fe), zinc (Zn), or copper (Cu).

The conductive powder may be a mixture of conductive powders having different particle shapes. For example, the conductive powder may have spherical, flake or amorphous shapes, or a combination thereof.

The conductive powder may have an average particle diameter (D50) of about 0.1 µm to about 5 µm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range, the paste may provide low contact resistance and low line resistance. As an example, the conductive powder may have an average particle diameter (D50) of about 0.5 µm to about 2 µm.

In one embodiment, the conductive powder may be a mixture of conductive powders having different average particle diameters (D50).

The conductive powder may be present in an amount of about 60 wt % to about 90 wt % in the paste for solar cell electrodes. Within this range, the conductive powder may help to prevent a deterioration in conversion efficiency of a solar cell due to resistance increase, and a difficulty in forming the paste due to relative reduction in amount of the organic vehicle may be avoided. In some embodiments, the conductive powder may be present in an amount of about 70 wt % to about 88 wt % in the paste for solar cell electrodes.

Glass Frit

The glass frit may serve to promote the formation of silver crystal particles in an emitter region by etching an anti-reflection layer and melting the silver particle so as to reduce contact resistance during a baking process of the paste for solar cell electrodes. Further, the glass frit may serve to enhance adhesion between the conductive powder and a wafer, and may be softened, thus decreasing the baking temperature during the sintering process.

When the area of a solar cell is increased in order to improve solar cell efficiency, contact resistance of the solar cell may increase. Thus, it is desirable to minimize the influence on the p-n junction while minimizing contact resistance. In addition, when the baking temperature varies within a broad range with increasing use of wafers having different sheet resistances, the paste for solar cell electrodes may include the glass frit to secure sufficient thermal stability even through a wide range of baking temperatures.

In one embodiment, the glass frit may include bismuth (Bi), tellurium (Te), and antimony (Sb).

The glass frit may be prepared by mixing compounds including bismuth (Bi), tellurium (Te), and antimony (Sb), respectively. For example, carbonates, sulfides, oxides, nitrides, and borides including bismuth (Bi), tellurium (Te) and antimony (Sb), respectively may be used, as examples. In some embodiments, the glass frit may be prepared from three or more metal oxides including bismuth oxides ($Bi_2O_3$), tellurium oxides ($TeO_2$), and antimony oxides ($Sb_2O_3$).

In one embodiment, the metal oxides may include from about 3 wt % to about 45 wt % of bismuth oxide ($Bi_2O_3$), from about 40 wt % to about 85 wt % of tellurium oxide ($TeO_2$), and from about 1 wt % to about 15 wt % of antimony oxide ($Sb_2O_3$). As an example, the metal oxides may include from about 5 wt % to about 40 wt % of bismuth oxide ($Bi_2O_3$), from about 50 wt % to about 80 wt % of tellurium oxide ($TeO_2$), and from about 1 wt % to about 15 wt % of antimony oxide ($Sb_2O_3$).

In another embodiment, the metal oxides may include from about 5 wt % to about 35 wt % of bismuth oxide ($Bi_2O_3$), from about 40 wt % to about 80 wt % of tellurium oxide ($TeO_2$), from about 1 wt % to about 10 wt % of antimony oxide ($Sb_2O_3$), from about 1 wt % to 10 wt % of lithium oxide ($Li_2O$), and from about 1 wt % to about 10 wt % of zinc oxide (ZnO).

In another embodiment, the glass fit may have a mole ratio of bismuth (Bi) to tellurium (Te) of about 1:1 to about 1:30, for example, about 1:1.5 to about 1:25. As examples, the glass frit may have the mole ratio of bismuth (Bi) to tellurium (Te) of about 1:1, 1:1.5, 1:2, 1:3, 1:4, 1:5, 1:6, 1:7, 1:8, 1:9, 1:10, 1:11, 1:12, 1:13, 1:14, 1:15, 1:16, 1:17, 1:18, 1:19, 1:20, 1:21, 1:22, 1:23, 1:24, 1:25, 1:26, 1:27, 1:28, 1:29, or 1:30. In some implementations, the mole ratio of bismuth (Bi) to tellurium (Te) may be in a range of at least one of values described above and less than one of values described above. Within this range, the glass frit may secure excellent conversion efficiency.

In still another embodiment, the glass frit may have a mole ratio of bismuth (Bi) to antimony (Sb) of about 1:0.05 to about 1:5, or, for example, about 1:0.1 to about 1:3.5. For example, the glass frit may have the mole ratio of bismuth (Bi) to antimony (Sb) of about 1:0.05, 1:0.1, 1:0.2, 1:0.3, 1:0.4, 1:0.5, 1:0.6, 1:0.7, 1:0.8, 1:0.9, 1:1.0, 1:1.1, 1:1.2, 1:1.3, 1:1.4, 1:1.5, 1:1.6, 1:1.7, 1:1.8, 1:1.9, 1:2.0, 1:2.1, 1:2.2, 1:2.3, 1:2.4, 1:2.5, 1:2.6, 1:2.7, 1:2.8, 1:2.9, 1:3.0, 1:3.1, 1:3.2, 1:3.3, 1:3.4, 1:3.5, 1:3.6, 1:3.7, 1:3.8, 1:3.9, 1:4.0, 1:4.1, 1:4.2, 1:4.3, 1:4.4, 1:4.5, 1:4.6, 1:4.7, 1:4.8, 1:4.9, or 1:5.0. In some implementations, the mole ratio of bismuth (Bi) to antimony (Sb) may be a range of at least one of values described above and less than one of values described above. Within this range, the glass frit may secure low contact resistance and excellent conversion efficiency.

The glass frit may further include at least one of lithium (Li), sodium (Na), zinc (Zn), and tungsten (W).

In one embodiment, a mole ratio of bismuth (Bi) to zinc (Zn) may be from about 1:0.1 to about 1:5, or, for example, from about 1:0.5 to about 1:3. Within this range, the glass frit may secure excellent conversion efficiency.

In another embodiment, a mole ratio of bismuth (Bi) to tungsten (W) may be from about 1:0.001 to about 1:5, or, for example, about 1:0.01 to about 1:1. Within this range, the glass frit may secure excellent conversion efficiency.

The mole ratio may be determined by measuring a mole ratio of metal components in the glass frit using an Inductively Coupled Plasma Atom Emission Spectroscopy (ICP-OES) according to the following method ((1) to (3)).

(1) Pretreatment of specimen: About 0.5 g of glass frit, as an analyte specimen, is charged into a beaker and weighted accurately up to 0.0001 g scale. About 5 ml of a sulfuric acid ($H_2SO_4$) is put into the beaker having the specimen, and heated at about 220° C. for about 3 hours using a hot plate to completely carbonize the specimen. Until the beaker having the carbonized specimen becomes clear, hydrogen peroxide ($H_2O_2$) is put into the beaker to complete the pretreatment.

(2) Preparation of reference solution: A solution of element bismuth (Bi), tellurium (Te), and antimony (Sb), as an analyte references, is prepared.

(3) Measurement of a mole ratio of metal components: Nitric acid ($HNO_3$) is charged into the beaker having the pretreated specimen, and then heated for about 5 minutes and air cooled. The prepared reference solution is put into an ICP-OES measuring device (PerkinElmer, Inc.) and a calibration curve is plotted using an external standard method. Then, the concentrations (ppm) of elemental bismuth (Bi), tellurium (Te), and antimony (Sb), an analyte element, in the specimen are determined using the ICP-OES measuring device to calculate a mole ratio of Bi:Te and Bi:Sb in the glass frit according to the following equation. If bismuth (Bi) is 1, the mole ratios of tellurium (Te) or antimony (Sb) are shown in Table 2, respectively.

Content of each element (%)=concentration of each element (ppm)×Dilution Factor (DF)/10,000

Mole of each element=Content of each element/molecular weight of each element

Mole ratio of Bi:Te=1:(mole of Te/mole of Bi)

Mole ratio of Bi:Sb=1:(mole of Sb/mole of Bi)

The glass frit may be prepared from the metal oxides described above by any typical method. For example, the metal oxides may be mixed in a ratio of metal oxides described above. Mixing may be carried out using a ball mill or a planetary mill. The mixed composition may be melted at 900° C. to 1300° C., followed by quenching at 25° C. The obtained resultant may be subjected to pulverization using a disc mill, a planetary mill, or the like, thereby providing a glass frit.

The glass fit may have an average particle diameter (D50) of about 0.1 µm to about 5 µm, or, for example, about 0.5 to about 3 µm. Within this range, it may be possible to prevent the deep-section curing of the UV wavelength, and may be possible to not cause the pin-hole defect in the developing process when forming the electrodes. The glass frit may have spherical or amorphous shapes.

The glass fit may be present in an amount of about 1 wt % to about 10 wt % in the paste for solar cell electrodes. Within this range, the glass frit may prevent deterioration in conversion efficiency of a solar cell due to the increase in the sinterability, adhesive strength and resistance of the conductive powder. In addition, the glass frit may prevent the possibility of increasing resistance and deteriorating solderability due to the excess amount of the glass frit remaining after the backing process. For example, the glass frit may be present in an amount of about 1 wt % to about 7 wt % in the paste for solar cell electrodes.

Organic Vehicle

The organic vehicle may impart suitable viscosity and rheological characteristics for printing the paste composition through the mechanical mixing with the inorganic component of the paste for solar cell electrodes.

The organic vehicle may be a suitable organic vehicle used for the paste for solar cell electrodes. The organic vehicle may include an organic binder, a solvent, or the like. In some embodiments, the organic vehicle may be a solution in which the organic binder is dissolved in the solvent. For example, the organic vehicle may include from about 5 wt % to about 40 wt % of the organic binder and from about 60 wt % to about 95 wt % of the solvent. For example, the organic vehicle may include from about 6 wt % to about 30 wt % of the organic binder and from about 70 wt % to about 94 wt % of the solvent.

The organic binder may include a cellulose polymer, such as ethyl cellulose, hydroxyethyl cellulose, hydroxypropyl cellulose or hydroxyethyl hydroxypropyl cellulose or the like, an acrylic copolymer prepared copolymerizing acrylic monomer having hydrophilic carboxyl group, or the like, a polyvinyl resin, or the like, alone or combinations thereof, as examples.

The organic solvent having a boiling point of about 120° C. or more may be used as the solvent. As examples, the organic solvent may include at least one of a carbitol, an aliphatic alcohol, an ester, a cellosolve, and a hydrocarbon. For example, the solvent may include butyl carbitol, butyl carbitol acetate, methyl cellosolve, ethyl cellosolve, butyl cellosolve, aliphatic alcohol, terpineol, ethylene glycol, ethylene glycol mono butyl ether, butyl cellosolve acetate, texanol, or mixtures thereof.

The organic vehicle may be present in an amount of about 5 wt % to about 30 wt % in the paste for solar cell electrodes. Within this range, it may be possible to prevent inefficient dispersion or excessive increase in viscosity after preparing the composition, which could lead to difficulty in the printing, and to prevent resistance increase and other issues that could occur during the baking process. As an example, the organic vehicle may be present in an amount of about 10 wt % to about 25 wt % in the paste for solar cell electrodes.

Additive

The paste for solar cell electrodes may further include a suitable additive, in addition to the component as described, as needed, to enhance flow properties, process properties and stability. The additive may further include a dispersant, a thixotropic agent, a plasticizer, a viscosity stabilizer, an anti-foaming agent, a pigment, an UV stabilizer, an antioxidant, a coupling agent, or the like. These additives may be used alone or as mixtures thereof. These additives may be present in a suitable amount, for example, an amount of about 0.1 wt % to about 5 wt % in the paste for solar cell electrodes.

Solar Cell Electrode and Solar Cell including the Same

Other aspects of the invention relate to an electrode formed of the paste for solar cell electrodes and a solar cell including the same. FIG. 1 shows the structure of a solar cell in accordance with an embodiment.

Referring to FIG. 1, a rear electrode 210 and a front electrode 230 may be formed by printing and baking the paste for solar cell electrodes on a wafer 100 or substrate that includes a p-layer 101 and an n-layer 102, which will serve as an emitter. For example, a preliminary process of preparing the rear electrode 210 may be performed by printing the paste composition for solar cell electrodes onto the rear surface of the wafer 100 and drying the printed paste composition at 200° C. to 400° C. for 10 seconds to 60 seconds. Further, a preliminary process of preparing the front electrode may be performed by printing the paste composition on the front surface of the wafer and drying the printed composition. The front electrode 230 and the rear electrode 210 may be formed by baking the wafer at 400° C. to 950° C., or, for example, at 850° C. to 950° C., for 30 seconds to 50 seconds.

The following Examples and Comparative Example are provided in order to highlight characteristics of one or more embodiments, but it will be understood that the Examples and Comparative Example are not to be construed as limiting the scope of the embodiments, nor is the Comparative Example to be construed as being outside the scope of the embodiments. Further, it will be understood that the embodiments are not limited to the particular details described in the Examples and Comparative Example.

EXAMPLE

Example 1

0.8 wt % of ethyl cellulose (STD4, Dow chemical company) (Mw=50,000 g/mol) was sufficiently dissolved in 8.5 wt % of butyl carbitol at 60° C. to prepare an organic vehicle. Then, 86.5 wt % of a spherical silver powder (AG-4-8, Dowa Hightech Co. Ltd.) having an average particle diameter of 2.0 μm, 3.5 wt % of a glass frit prepared according to the composition shown in Table 1, 0.2 wt % of a dispersant BYK102 (BYK-chemie) and 0.5 wt % of a thixotropic agent Thixatrol ST (Elementis Co., Ltd.) as additives were added to the organic vehicle, followed by mixing and kneading in a 3-roll kneader, thereby preparing a composition for solar cell electrodes.

The prepared paste was applied by rolling the prepared paste onto a screen plate, and discharging the prepared paste to the printing area of the screen plate with a squeezer while printing a polycrystalline surface having an average sheet resistance of 90Ω. Then, the resultant was baked in a furnace at a 6-zone temperature of 980° C. and at a belt speed of 260 ipm (inches per minute). A mole ratio of each component is shown in Table 2.

Examples 2 to 16 and Comparative Example

Electrodes were prepared in the same manner as in Example 1 except that the glass frits were prepared from the compositions as listed in Table 1. A mole ratio of each component is shown in Table 2.

TABLE 1

|  | $Bi_2O_3$ (wt %) | $TeO_2$ (wt %) | $Sb_2O_3$ (wt %) | $Li_2O$ (wt %) | $Na_2CO_3$ (wt %) | ZnO (wt %) | $WO_3$ (wt %) |
| --- | --- | --- | --- | --- | --- | --- | --- |
| Ex. 1 | 9.0 | 76.0 | 1.0 | 6.0 | 0.0 | 7.0 | 1.0 |
| Ex. 2 | 11.5 | 70.5 | 4.0 | 5.0 | 1.0 | 8.0 | 0.0 |
| Ex. 3 | 5.0 | 66.0 | 9.5 | 7.0 | 2.5 | 7.0 | 3.0 |
| Ex. 4 | 23.7 | 49.8 | 8.0 | 4.0 | 2.0 | 9.5 | 3.0 |
| Ex. 5 | 16.5 | 67.5 | 2.0 | 4.0 | 1.0 | 8.0 | 1.0 |
| Ex. 6 | 30.0 | 41.0 | 9.5 | 7.0 | 2.5 | 7.0 | 3.0 |
| Ex. 7 | 11.2 | 62.3 | 8.0 | 4.0 | 2.0 | 9.5 | 3.0 |
| Ex. 8 | 23.7 | 54.8 | 7.5 | 8.0 | 2.0 | 4.0 | 0.0 |
| Ex. 9 | 5.0 | 76.0 | 5.0 | 2.0 | 2.0 | 8.0 | 2.0 |

TABLE 1-continued

|  | Bi$_2$O$_3$ (wt %) | TeO$_2$ (wt %) | Sb$_2$O$_3$ (wt %) | Li$_2$O (wt %) | Na$_2$CO$_3$ (wt %) | ZnO (wt %) | WO$_3$ (wt %) |
|---|---|---|---|---|---|---|---|
| Ex. 10 | 14.0 | 69.0 | 3.0 | 7.0 | 0.0 | 7.0 | 0.0 |
| Ex. 11 | 30.0 | 51.0 | 5.0 | 2.0 | 1.0 | 7.0 | 4.0 |
| Ex. 12 | 11.2 | 67.3 | 7.5 | 4.0 | 2.0 | 5.0 | 3.0 |
| Ex. 13 | 9.0 | 72.0 | 5.0 | 9.0 | 0.0 | 3.0 | 2.0 |
| Ex. 14 | 19.0 | 62.0 | 5.0 | 8.0 | 2.0 | 4.0 | 0.0 |
| Ex. 15 | 11.5 | 72.5 | 2.0 | 6.0 | 1.0 | 6.0 | 1.0 |
| Ex. 16 | 17.5 | 58.5 | 10.0 | 7.0 | 2.0 | 4.0 | 1.0 |
| C.E. | 3.0 | 70.0 | 5.0 | 6.0 | 1.0 | 8.0 | 7.0 |

Method of Measuring a Mole Ratio of Metal Components in the Glass Frit

The mole ratio of metal components in the glass frit was determined using an Inductively Coupled Plasma Atom Emission Spectroscopy (ICP-OES) according to the following method.

(1) Pretreatment of specimen: About 0.5 g of glass frit, as an analyte specimen, was charged into a beaker and weighed accurately up to 0.0001 g scale. About 5 ml of a sulfuric acid (H$_2$SO$_4$) was put into the beaker having the specimen, and heated at about 220° C. for about 3 hours using a hot plate to completely carbonize the specimen. When the beaker having the carbonized specimen became clear, hydrogen peroxide (H$_2$O$_2$) was put into the beaker to complete the pretreatment.

(2) Preparation of reference solution: A solution of element bismuth (Bi), tellurium (Te), and antimony (Sb), as an analyte reference, was prepared, respectively.

(3) Measurement of a mole ratio of metal components: Nitric acid (HNO$_3$) was charged into the beaker having the pretreated specimen, and then heated for about 5 minutes and air cooled. The prepared reference solution was put into an ICP-OES measuring device (PerkinElmer, Inc.), and a calibration curve was plotted using an external standard method. Then, the concentrations (ppm) of element bismuth (Bi), tellurium (Te), and antimony (Sb), as analyte elements in the specimen were determined using the ICP-OES measuring device to calculate a mole ratio of Bi:Te and Bi:Sb in the glass frit according to the following equation. If bismuth (Bi) is 1, the mole ratios of tellurium (Te) or antimony (Sb) are shown in Table 2, respectively.

Content of each element (%)=concentration of each element (ppm)×Dilution Factor (DF)/10000

Mole of each element=Content of each element/molecular weight of each element

Mole ratio of Bi:Te=1:(mole of Te/mole of Bi)
Mole ratio of Bi:Sb=1:(mole of Sb/mole of Bi)

TABLE 2

|  | Mole ratio of Bi:Te | Mole ratio of Bi:Sb |
|---|---|---|
| Ex. 1 | 12.3 | 0.17 |
| Ex. 2 | 8.9 | 0.56 |
| Ex. 3 | 19.14 | 3.04 |
| Ex. 4 | 3.04 | 0.54 |
| Ex. 5 | 5.93 | 0.19 |
| Ex. 6 | 1.98 | 0.51 |
| Ex. 7 | 8.87 | 1.14 |
| Ex. 8 | 3.35 | 0.51 |
| Ex. 9 | 22.04 | 1.6 |
| Ex. 10 | 7.15 | 0.34 |
| Ex. 11 | 2.47 | 0.27 |
| Ex. 12 | 8.71 | 1.07 |
| Ex. 13 | 11.6 | 0.89 |
| Ex. 14 | 4.73 | 0.42 |

TABLE 2-continued

|  | Mole ratio of Bi:Te | Mole ratio of Bi:Sb |
|---|---|---|
| Ex. 15 | 9.14 | 0.28 |
| Ex. 16 | 4.85 | 0.91 |
| C.E. | 33.8 | 2.67 |

Method of Measuring Physical Properties

Contact resistance (Rs) and conversion efficiency (%) of electrodes prepared from the compositions prepared in Examples 1 to 16 and Comparative Example was measured using a Pasan cell tester. The results are shown in Table 3.

TABLE 3

|  | Rs (mΩ) | Eff. (%) |
|---|---|---|
| Ex. 1 | 2.613 | 16.94 |
| Ex. 2 | 2.664 | 16.88 |
| Ex. 3 | 2.890 | 16.82 |
| Ex. 4 | 2.918 | 16.79 |
| Ex. 5 | 2.673 | 16.87 |
| Ex. 6 | 2.864 | 16.84 |
| Ex. 7 | 2.902 | 16.80 |
| Ex. 8 | 2.823 | 16.84 |
| Ex. 9 | 2.673 | 16.87 |
| Ex. 10 | 2.291 | 16.97 |
| Ex. 11 | 2.735 | 16.86 |
| Ex. 12 | 2.733 | 16.86 |
| Ex. 13 | 2.642 | 16.91 |
| Ex. 14 | 2.685 | 16.87 |
| Ex. 15 | 2.642 | 16.89 |
| Ex. 16 | 2.780 | 16.85 |
| C.E. | 2.966 | 15.20 |

As shown in Table 3, it was ascertained that the solar cell electrodes prepared from the compositions prepared in Examples 1 to 16 exhibited considerably low contact resistance and excellent conversion efficiency. Meanwhile, for Comparative Example, it was ascertained that the solar cell exhibited higher contact resistance and also lower conversion efficiency.

By way of summation and review, electrodes of a solar cell may be formed on a wafer by applying, patterning, and baking a paste for solar cell electrodes.

Recently, the continuous reduction in the thickness of the emitter of the solar cell in order to improve solar cell efficiency has led to issues of shunting, which can deteriorate the solar cell performance. In addition, as the area of the solar cell has been gradually increased to increase the efficiency of the solar cell, issues of deterioration in efficiency due to the increase in contact resistance of the solar cell have arisen.

Therefore, a glass frit and a paste for solar cell electrodes that can secure sufficiently low contact resistance and increase conversion efficiency and a paste for solar cell electrodes covering from low sheet resistance to high sheet resistance is desirable.

Embodiments provides a paste for solar cell electrodes capable of minimizing a contact resistance.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope as set forth in the following claims.

What is claimed is:

1. A paste for solar cell electrodes, the paste comprising:
a conductive powder, a glass frit, and an organic vehicle, wherein the glass frit is prepared from a metal oxides mixture comprising lithium oxide ($Li_2O$) in an amount of 2 wt % to about 10 wt %, bismuth oxide ($Bi_2O_3$) in an amount of about 3 wt % to about 45 wt %, tellurium oxide ($TeO_2$) in an amount of 40 wt % to 85 wt %, tungsten oxide ($WO_3$) in an amount of 0 wt % to 4 wt %, and zinc oxide (ZnO) in an amount of 3 wt % to 9.5 wt %, wherein the glass frit includes bismuth (Bi), tellurium (Te), lithium (Li), antimony (Sb), and zinc (Zn), and optionally tungsten (W), and has a mole ratio of bismuth (Bi) to tellurium (Te) of 1:1.5 to about 1:30, wherein the glass frit has a mole ratio of bismuth (Bi) to antimony (Sb) of about 1:0.05 to about 1:5, and wherein, when the glass frit includes tungsten(W), a mole ratio of bismuth (Bi) to tungsten (W) is about 1:0.01 to about 1:1.

2. The paste for solar cell electrodes as claimed in claim 1, wherein the glass frit further includes sodium (Na).

3. The paste for solar cell electrodes as claimed in claim 1, including:

from about 60 wt % to about 90 wt % of the conductive powder;

from about 1 wt % to about 10 wt % of the glass fit; and from about 5 wt % to about 30 wt % of organic vehicle.

4. The paste for solar cell electrodes as claimed in claim 1, wherein the conductive powder includes at least one of silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and indium tin oxide (ITO).

5. The paste for solar cell electrodes as claimed in claim 1, wherein the glass frit has an average particle diameter (D50) of about 0.1 μm to about 5 μm.

6. The paste for solar cell electrodes as claimed in claim 1, further including at least one of a dispersant, a thixotropic agent, a plasticizer, a viscosity stabilizer, an anti-foaming agent, a pigment, a UV stabilizer, an antioxidant, and a coupling agent.

7. A solar cell electrode prepared from the paste for solar cell electrodes as claimed in claim 1.

* * * * *